United States Patent
Ku

(10) Patent No.: US 8,824,228 B2
(45) Date of Patent: Sep. 2, 2014

(54) INTEGRATED CIRCUIT CHIP AND MEMORY DEVICE

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 70 days.

(21) Appl. No.: 13/716,394

(22) Filed: Dec. 17, 2012

(65) Prior Publication Data

US 2014/0003170 A1 Jan. 2, 2014

(30) Foreign Application Priority Data

Jun. 28, 2012 (KR) .................. 10-2012-0069889

(51) Int. Cl.
| | | |
|---|---|---|
| G11C 7/00 | (2006.01) | |
| G01R 31/3185 | (2006.01) | |
| G11C 29/48 | (2006.01) | |
| G11C 29/54 | (2006.01) | |
| G11C 5/14 | (2006.01) | |

(52) U.S. Cl.
CPC *G01R 31/318555* (2013.01); *G01R 31/318572* (2013.01); *G11C 29/48* (2013.01); *G11C 29/54* (2013.01); *G11C 5/14* (2013.01)
USPC .. 365/201; 365/193; 365/189.03; 365/189.07

(58) Field of Classification Search
CPC ............... G01R 31/318555; G01R 31/318572; G11C 29/48; G11C 29/54; G11C 5/14
USPC ................ 365/201, 193, 189.03, 189.07
See application file for complete search history.

(56) References Cited

U.S. PATENT DOCUMENTS

| | | | | | |
|---|---|---|---|---|---|
| 5,404,359 | A | * | 4/1995 | Gillenwater et al. | 714/733 |
| 5,479,127 | A | * | 12/1995 | Bui | 327/174 |
| 5,659,508 | A | * | 8/1997 | Lamphier et al. | 365/201 |
| 6,006,339 | A | * | 12/1999 | McClure | 713/500 |
| 6,075,396 | A | * | 6/2000 | Amerian et al. | 327/198 |
| 6,208,571 | B1 | * | 3/2001 | Ikeda et al. | 365/201 |
| 6,452,847 | B2 | * | 9/2002 | Kim | 365/201 |
| 6,526,536 | B1 | * | 2/2003 | Chen et al. | 714/738 |
| 8,063,650 | B2 | * | 11/2011 | Ong et al. | 324/750.3 |
| 8,531,200 | B2 | * | 9/2013 | Yang | 324/762.01 |
| 2012/0096315 | A1 | * | 4/2012 | Jung | 714/31 |

FOREIGN PATENT DOCUMENTS

KR 1020110001069 1/2011

* cited by examiner

*Primary Examiner* — Viet Q Nguyen
(74) *Attorney, Agent, or Firm* — IP & T Group LLP

(57) ABSTRACT

An integrated circuit chip includes a test enable pad configured to receive a test enable signal, a plurality of test input pads including a reset pad, a signal combination unit configured to combine signals input to the plurality of test input pads when the test enable signal is activated, and to generate a plurality of test output signals, a plurality of test output pads configured to output the plurality of test output signals, and a reset control unit configured to generate a system reset signal using a signal input to the reset pad when the test enable signal is deactivated, and to generate the system reset signal using the test enable signal when the test enable signal is activated.

12 Claims, 4 Drawing Sheets

FIG. 1

| BA0 | BA1 | BG2 | DQ0 | DQ1 |
| --- | --- | --- | --- | --- |
| A0 | A1 | A2 | DQ2 | DQ3 |
| A3 | A4 | A5 | DQ4 | DQ5 |
| A6 | A7 | A8 | DQ6 | DQ7 |
| A9 | A10/AP | A11 | DQ8 | DQ9 |
| A12/BC_n | A13 | WE_n/A14 | DQ10 | DQ11 |
| CAS_n/A15 | RAS_n/A16 | RESET_n | DQ12 | DQ13 |
| CKE | ACT_n | ODT | DQ14 | DQ15 |
| CLK_t | CLK_c | DML_n/DBIL_N | DQSU_t | DQSU_c |
| DMV_n/DBIV_N | ALERT_n | PAR | DQSL_t | DQSL_c |

CS_n

TEN

US 8,824,228 B2

INTEGRATED CIRCUIT CHIP AND MEMORY DEVICE

CROSS-REFERENCE TO RELATED APPLICATIONS

The present application claims priority of Korean Patent Application No. 10-2012-0069889, filed on Jun. 28, 2012, which is incorporated herein by reference in its entirety.

BACKGROUND

1. Field

Exemplary embodiments of the present invention relate to an integrated circuit chip and a memory device, and more particularly, to a technology of testing whether each pad (pin) of an integrated circuit chip has been electrically connected to a substrate (board).

2. Description of the Related Art

When an integrated circuit chip such as a memory device is attached to a board, a test is performed to check a bonding state regarding whether bonding of a package has been normally made and pins have been normally connected to the board. The conventional art uses a scheme for testing a bonding state of a board and pins using a test scheme called a boundary scan test. However, since this scheme performs a test by shifting a test pattern, significant time is required.

In a recent memory device, a connectivity test scheme of simultaneously applying signals to a plurality of pads of a chip and testing an electrical connection state of the pads in a parallel manner has been proposed. In this regard, a chip design that stably supports a connectivity test of new scheme is required.

SUMMARY

Exemplary embodiments of the present invention are directed to an integrated circuit chip that ensures a stable operation while supporting a connectivity test scheme of quickly testing an electrical connection state of a plurality of pads on the integrated circuit chip.

In accordance with an embodiment of the present invention, an integrated circuit chip includes a test enable pad configured to receive a test enable signal, a plurality of test input pads including a reset pad, a signal combination unit configured to combine signals input to the plurality of test input pads when the test enable signal is activated, and to generate a plurality of test output signals, a plurality of test output pads configured to output the plurality of test output signals, and a reset control unit configured to generate a system reset signal using a signal input to the reset pad when the test enable signal is deactivated, and to generate the system reset signal using the test enable signal when the test enable signal is activated.

In accordance with another embodiment of the present invention, a memory device includes a test enable pad, a reset pad, a chip select pad, a plurality of control pads, a plurality of command pads, a plurality of address pads, a signal combination unit configured to combine signals, which are input to the reset pad, the plurality of control pads, the plurality of command pads, and the plurality of address pads, when a test enable signal input through the test enable pad is activated, and to generate a plurality of test output signals, an output circuit configured to output the plurality of test output signals through a plurality of data pads and a plurality of strobe pads in response to a chip select signal input through the chip select pad, and a reset control unit configured to generate a system reset signal using a signal input to the reset pad when the test enable signal is deactivated, and to generate the system reset signal using the test enable signal when the test enable signal is activated.

According to the present invention, a reset signal is internally activated in a connectivity test for checking an electrical connection of pads (pins) of an integrated circuit chip, so that a connectivity test operation may be performed after the integrated circuit chip is stably reset.

BRIEF DESCRIPTION OF THE DRAWINGS

FIG. 1 is a diagram illustrating package pins (pads) used in a connectivity test of a memory device.

DETAILED DESCRIPTION

Figure 2:
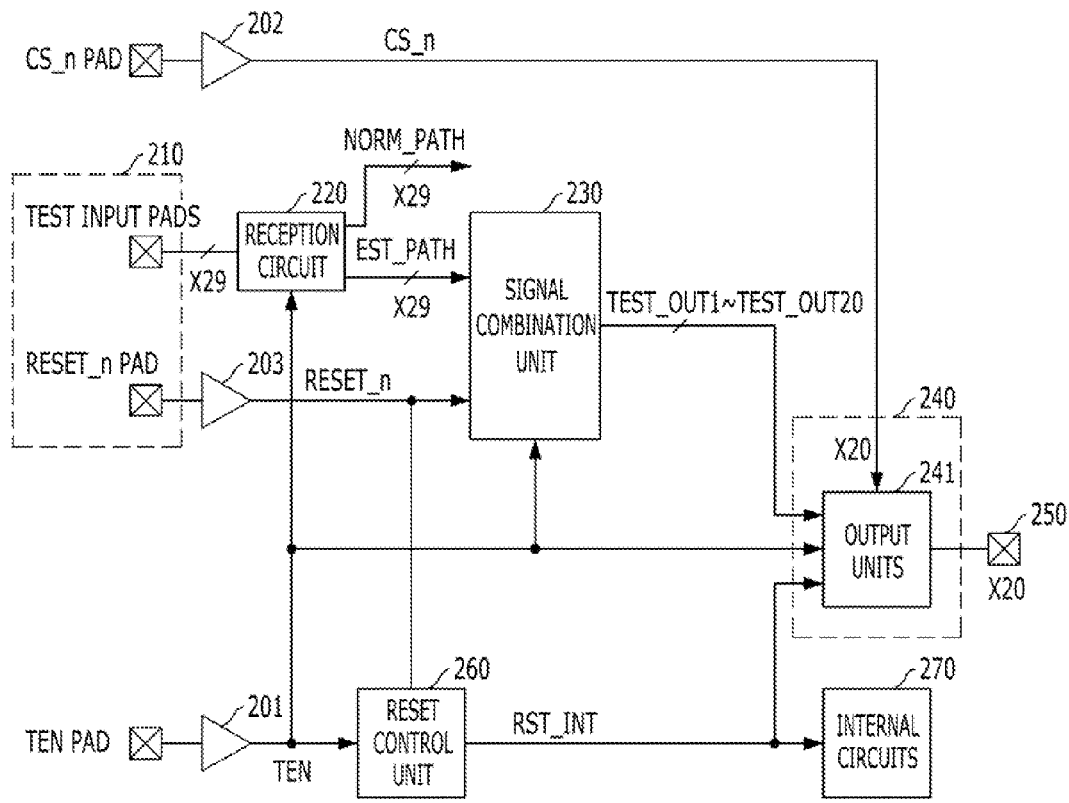
FIG. 2 is a block diagram illustrating a memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention, this specification, 'connected/coupled' represents that one component is directly coupled to another component or indirectly coupled through another component. In addition, a singular form may include a plural form as long as it is not specifically mentioned in a sentence.

FIG. 1 is a diagram illustrating package pins (pads) used in a connectivity test of a memory device.

The pads (pins) are used according to purposes thereof in the connectivity test, which will be described below.

1. A test enable pad: this pad is used to enable a connectivity test mode for a connectivity test. The test enable pad is indicated by TEN.

2. Chip select pad: a signal input to this pad is related to output of test output signals in the connectivity test. When a signal input to the chip select pad CS_n is at a 'low' level, the test output signals are output to test output pads, and when the signal input to the chip select pad CS_n is not at a 'low' level, the test output pads are tri-stated.

3. Test input pads: in the connectivity test mode, input signals for the connectivity test are input to the test input pads. The test input pads include $0^{th}$ and first bank address pads BA0 and BA1, a $0^{th}$ bank group address pad BG0, $0^{th}$ to ninth address pads A0 to A9, a tenth address/auto-precharge pad A10/AP, an eleventh address pad A11, an twelfth address/burst chop pad A12/BC_n, a thirteenth address pad A13, a write enable/fourteenth address pad WE_n/A14, a column address strobe/fifteenth address pad CAS_n/A15, a row address strobe/sixteenth address pad RAS . . . n/A16, a reset pad RESET_n, a clock enable pad CINE, an active pad ACT_n, an on-die termination pad ODT, a clock pad CLK_t, a clock bar pad CLK_c, a data mask low/data bus inversion low pad DML_n/DBIL_n, a data mask up data bus inversion up pad DMU_n/DBIU_n, an alert pad ALERT_n, and a parity pad PAR. Among these pads, the pads BA0, BA1, BG0, A0 to A9, A10/AP, A11, A12/BC_n, and A13 are classified into address pads, the pads WE_n/A14, CAS_n/A15, RAS_n/A16, and ACT_n are classified into command pads, and the pads CKE, ODT, CLK_t, CLK_c, DML_n/DBIL_n, DMU_n/DBIU_n, ALERT_n, PAR, and RESET_n are classified into control pads.

4. Test output pads: in the connectivity test mode, test output signal's generated by logically combining signals input to the test input pads are output to the test output pads. The test output pads include 16 data pads DQ0 to DQ15 and four strobe pads DQSU_t, DQSU_c, DQS_J, and DQSL_c.

FIG. 2 is a configuration diagram of the memory device in accordance with an embodiment of the present invention.

Referring to FIG. 2, the memory device includes a test enable pad TEN PAD configured to receive a test enable signal TEN, a chip select pad CS_n PAD configured to receive a chip select signal CS_n, a plurality of test input pads 210, a reception circuit 220, a signal combination unit 230, an output circuit 240, a plurality of test output pads 250, a reset control unit 260, and internal circuits 270.

A buffer 201 connected to the test enable pad TEN PAD is configured to buffer the test enable signal TEN and transfer the buffered test enable signal TEN to the signal combination unit 230 and the reset control unit 260. The test enable signal TEN substantially maintains a 'high' level in the connectivity test mode, and substantially maintains a 'low' level in a normal operation. A buffer 202 connected to the chip select pad CS_n PAD is configured to buffer the chip select signal CS_n and transfer the buffered chip select signal CS_n to the output circuit 240. The chip select signal CS_n may be transferred to another circuit (for example, a command decoder) other than the output circuit 240 in the normal operation.

The plurality of test input pads 210 may include 29 pads TEST INPUT PADs other than a reset pad RESET_n PAD. As described above, these pads 210 may be classified into the address pads BA0, BA1, BG0, A0 to A9, A10/AP, A11, A12/BC_n, and A13, the command pads WE_n/A14, CAS_n/A15, RAS_n/A16, and ACT_n, and the control pads CKE, ODT, CLK_t, CLK_c, DML_n/DBIL_n DMU_n/DBIU_n, ALERT_n, PAR, and RESET_n.

A buffer 203 is configured to buffer a reset signal RESET_n input to the reset pad RESET_n PAD and to transfer the buffered reset signal RESET_n to the reset control unit 260 and the signal combination unit 230. The reception circuit 220 is configured to receive signals input to the test input pads TEST INPUT PADs except for the reset pad RESET_n PAD, to transfer the received signals to the signal combination unit 230 in the connectivity test mode in which the test enable signal TEN is activated, and to transfer the received signals to a normal path NORM_PATH in a normal mode in which the test enable signal TEN is deactivated. Transferring the signals to the normal path NORM_PATH represents that signals input to the address pads BA0, BA1, BG0, A0 to A9, A10/AP, A11, A12/BC_n and A13 are transferred to an address decoder, signals input to the command pads WE_n/A14, CAS_n/A15, RAS_n/A16, and ACT_n are transferred to a command decoder, and signals input to the control pads CKE, ODT, CLK_t, CLK_c, DML_n/DBIL_n, DMU_n/DBIU_n, and ALERT_n are transferred to a control circuit. The internal configuration of the reception circuit 220 will be described in detail with reference to FIG. 3 and FIG. 4.

The signal combination unit 230 is configured to generate test output signals TEST_OUT1 to TEST_OUT20 using the test input signals transferred from the reception circuit 220. The signal combination unit 230 is configured to logically combine the test input signals using XOR gates and inverters and generate the test output signals TEST_OUT1 to TEST_OUT20. Table 1 below shows logical combination methods for generating the test output signals TEST_OUT1 ter TEST_OUT20 by locally combining the test input signals and test output pads to which the generated test output signals TEST_OUT1 to TEST_OUT20 are output. In Table 1 below, XOR (A, B, C) represents that test output signals may be generated by the XOR gate employing signals A, B, and C as input, and INV(D) represents that test output signals may be generated by inverting a signal D through the inverter.

TABLE 1

| test output signal | logical combination method | test output pad |
| --- | --- | --- |
| TEST_OUT1 | XOR (A1, A6, PAR) | DQ0 |
| TEST_OUT2 | INV (TEST_OUT1) | DQ1 |
| TEST_OUT3 | XOR (A8, ALERT_n, A9) | DQ2 |
| TEST_OUT4 | INV (TEST_OUT3) | DQ3 |
| TEST_OUT5 | XOR (A2, A5, A13) | DQ4 |
| TEST_OUT6 | INV (TEST_OUT5) | DQ5 |
| TEST_OUT7 | XOR (A0, A7, A11) | DQ6 |
| TEST_OUT8 | INV (TEST_OUT7) | DQ7 |
| TEST_OUT9 | XOR (CLK_n, ODT, CAS_n/A15) | DQ8 |
| TEST_OUT10 | INV (TEST_OUT9) | DQ9 |
| TEST_OUT11 | XOR (CKE, RAS_n/A16, A10/AP) | DQ10 |
| TEST_OUT12 | INV (TEST_OUT11) | DQ11 |
| TEST_OUT13 | XOR (ACT_n, A4, BA1) | DQ12 |
| TEST_OUT14 | INV (TEST_OUT13) | DQSL_c |
| TEST_OUT15 | XOR (DMU_n/DBIU_n, DML_N/DBIL_n, CLK_t) | DQ13 |
| TEST_OUT16 | INV (TEST_OUT15) | DQSU_c |
| TEST_OUT17 | XOR (WE_n/A14, A12/BC, BA0) | DQ14 |
| TEST_OUT18 | INV (TEST_OUT17) | DQ15 |
| TEST_OUT19 | XOR (BG0, A3, RESET_n) | DQSL_t |
| TEST_OUT20 | INV (TEST_OUT19) | DQSU_t |

The signal combination unit 230 is configured to receive the test enable signal TEN. When the test enable signal TEN is activated, the signal combination unit 230 is activated, and when the test enable signal TEN is deactivated, the signal combination unit 230 is deactivated. The deactivation of the signal combination unit 230 may represent that the input of the test input signals to the signal combination unit 230 is interrupted, or the supply of power to the signal combination unit 230 is interrupted.

The output circuit 240 is configured to output the test output signals TEST_OUT1 to TEST_OUT20 generated by the signal combination unit 230 to the plurality of test output pads 250. As an example, the output circuit 240 includes 20 output units 241, wherein each of the output units 241 may include a pipe latch and an output driver for signal output. As described above, the test output pads 250 may include the 16 data pads DQ0 to DQ15 and the four strobe pads DQSU_t, DQSU_c, DQSL_t, and DQSL_c. With reference to Table 1 above, it is possible to understand pads of the test output pads 250 to which the test output signals are output. The output circuit 240 is controlled by the chip select signals CS_n in a connectivity test mode period, that is, an activation period of the test enable signal TEN. In this period, when the chip select signals CS_n at a 'low' level is applied, the test output signals TEST_OUT1 to TEST_OUT20 are output to the test output pads 250. Otherwise, the test output pads 250 are tri-stated. In a normal mode other than the connectivity test mode, the output circuit 240 outputs signals corresponding to purposes of the pads. For example, in the normal mode, the output circuit 240 outputs data to the data pads DQ0 to DQ15 while outputting a data strobe signal to the strobe pads DQSU_t DQSU_c, DQSL_t, and DQSL_c. A reset signal RST_INT input to the output circuit 240 is used to initialize the pipe latches and the like of the output units 241.

A host (for example, a memory controller) connected to the memory device on a board transfers the test input signals to the test input pads 210 in the connectivity test mode, and checks the test output signals output from the memory device through the test output pads 250, thereby checking electrical connection of the test input pads 210 and the test output pads 250.

The reset control unit 260 is configured to generate a system reset signal RST_INT in the memory device. When the test enable signal TEN is deactivated, the reset control unit 260 generates the system reset signal RST_INT using a signal input to a reset pad RESET_n PAD, and when the test enable signal TEN is activated, the reset control unit 260 generates the system reset signal RST_INT using the test enable signal TEN. The internal configuration of the reset control unit 260 will be described in detail with reference to FIG. 5.

In general, a memory device uses a signal applied to the reset pad RESET_n PAD as the system reset signal. However, in the connectivity test mode, the reset pad RESET_n PAD is not used for system reset, and used to receive a test input signal. Accordingly, in the connectivity test mode, the internal circuits 270 of the memory device may not be reset or initialized using the reset pad RESET_n PAD. When the internal circuits 270 of the memory device are not reset, the operation of the memory device is very unstable due to latch-up, an erroneous initial value and the like. The embodiment of the present invention generates the system reset signal RST_INT using the reset control unit 260 even in the connectivity test mode, thereby ensuring a stable operation of the memory device.

The internal circuits 270 are configured to be initialized using the system reset signal in the memory device. Such circuits may include voltage generation circuits, various latch circuits, various flip-flop circuits, and various control circuits. As described above, when the internal circuits 270 are not reset, the stable operation of the memory device may not be secured.

Figure 3:
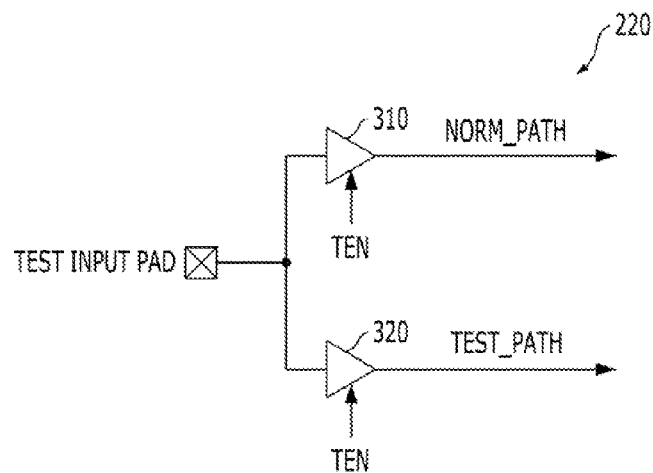
FIG. 3 is a detailed diagram illustrating a reception circuit 220 of FIG. 2 in accordance with an embodiment.

FIG. 3 is a configuration diagram of the reception circuit 220 of FIG. 2 in accordance with an embodiment.

FIG. 3 illustrates only elements corresponding to one test input pad TEST INPUT PAD of the elements of the reception circuit 220. Actually, the reception circuit 220 may include 29 circuits as illustrated in FIG. 3.

Referring to FIG. 3, the reception circuit 220 includes two buffers 310 and 320. The buffer 310 is provided for the normal operation and the buffer 320 is provided for the connectivity test mode. The buffer 310 is configured to be activated when the test enable signal TEN is deactivated, and to transfer a signal input to the test input pad TEST INPUT PAD to the normal path NORM_PATH. The buffer 320 is configured to be activated when the test enable signal TEN is activated, and to transfer the signal input to the test input pad TEST INPUT PAD to a test path TEST_PATH.

Since the buffer 310 should support the normal operation in which a high frequency signal is input to the test input pad TEST INPUT PAD, the buffer 310 may be a differential type buffer. Meanwhile, in the connectivity test mode, since the high frequency signal is not input to the test input pad TEST INPUT PAD, the buffer 310 may be a CMOS type (a single-ended type having a configuration similar to that of an inverter) buffer.

Figure 4:
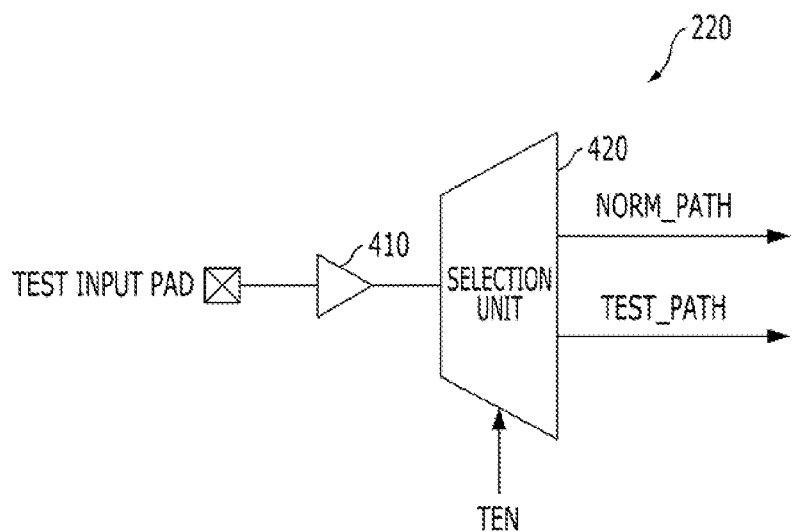
FIG. 4 is a detailed diagram illustrating a reception circuit 220 of FIG. 2 in accordance with another embodiment.

FIG. 4 is a configuration diagram of the reception circuit 220 of FIG. 2 in accordance with another embodiment.

Similarly to FIG. 3, FIG. 4 illustrates only elements corresponding to one test input pad TEST INPUT PAD of the elements of the reception circuit 220. Actually, the reception circuit 220 may include 29 circuits as illustrated in FIG. 4.

Referring to FIG. 4, the reception circuit 220 includes a buffer 410 and a selection unit 420. The buffer 410 is configured to buffer a signal input to the test input pad TEST INPUT PAD and transfer the buffered signal to the selection unit 420. The selection unit 420 is configured to transfer the signal transferred through the buffer 410 to the test path TEST_PATH when the test enable signal TEN is activated, and to transfer the signal transferred through the buffer 410 to the normal path NORM_PATH when the test enable signal TEN is deactivated.

Since the buffer 410 operates even in the normal mode in which a high frequency signal is input through the test input pad TEST INPUT PAD, the buffer 410 may be a differential type buffer.

Figure 5:
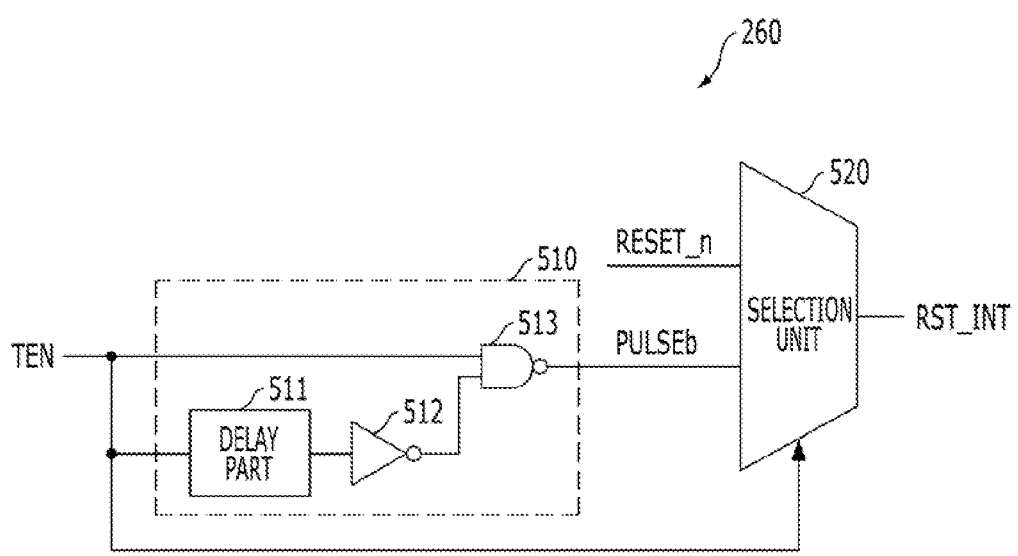
FIG. 5 is a detailed diagram illustrating a reset control unit 260 of FIG. 2 in accordance with an embodiment.

FIG. 5 is a configuration diagram of the reset control unit 260 of FIG. 2 in accordance with an embodiment.

Referring to FIG. 5, the reset control unit 260 includes a pulse generation section 510 and a selection section 520.

The pulse generation section 510 is configured to generate a pulse signal PULSEb using the test enable signal TEN. The pulse signal PULSEb is activated to a 'low' level in a period in which the test enable signal TEN is activated to a 'high' level. The pulse generation section 510 may include a delay part 511, an inverter 512, and a NAND gate 513.

The selection section 520 is configured to output a signal input to the reset pad as the system reset signal while the test enable signal has a 'low' level, and to output the pulse signal as the system reset signal while the test enable signal has a 'high' level.

As a consequence, the reset control unit 260 provides a signal input to the reset pad RESET_n as the system reset signal RST_INT in the normal mode, and activates the system reset signal RST_INT to a 'low' level when the test enable signal TEN is activated in the connectivity test mode.

Figure 6:
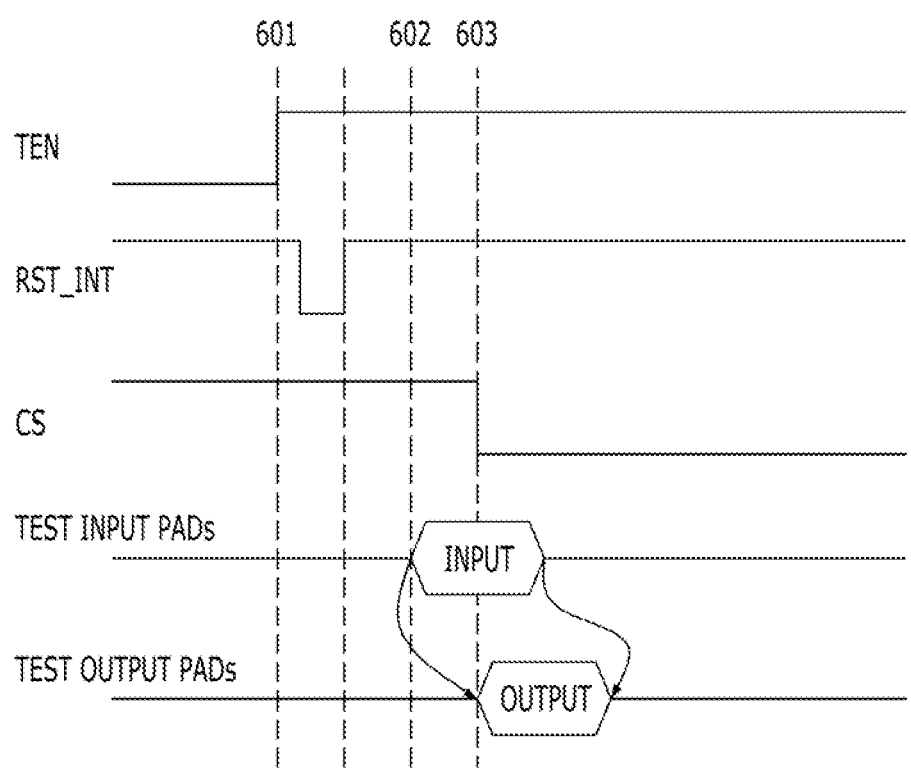
FIG. 6 is a timing diagram illustrating an operation of a memory device of FIG. 2 in a connectivity test mode.

FIG. 6 is a timing diagram illustrating an operation of the memory device of FIG. 2 in the connectivity test mode.

At a time point '601', the test enable signal TEN is activated to a 'high' level and the memory device enters the connectivity test mode. Then, the system reset signal RST_INT is activated to a 'low' level in response to the activation of the test enable signal TEN. The internal circuits in the memory device are initialized by the system reset signal RST_INT and stably operate.

At a time point '602', the test input signals are input to the memory device through the test input pads 210. Then, the signal combination unit 230 generates the test output signals TEST_OUT1 to TEST_OUT20 using the test input signals.

At a time point '603', when the chip select signal CS_n is changed to a 'low' level, the output circuit 240 outputs the test output signals TEST_OUT1 to TEST_OUT20 through the test output pads 250.

While the present invention has been described with respect to the specific embodiments, it will be apparent to those skilled in the art that various changes and modifications may be made without departing from the spirit and scope of the invention as defined in the following claims.

Furthermore, in the aforementioned embodiments, the present invention is applied to the memory device. However, the present invention may be applied to all kinds of integrated circuit chips including a reset pad used to test an electrical connection of pads and subject to a connectivity test, as well as the memory device. Furthermore, the type and number of pads used in the connectivity test may be changed according to an integrated circuit chip.

What is claimed is:

1. An integrated circuit chip comprising:
   a test enable pad configured to receive a test enable signal;
   a plurality of test input pads including a reset pad;
   a signal combination unit configured to combine signals input to the plurality of test input pads when the test enable signal is activated, and to generate a plurality of test output signals;
   a plurality of test output pads configured to output the plurality of test output signals; and
   a reset control unit configured to generate a system reset signal using a signal input to the reset pad when the test enable signal is deactivated, and to generate the system reset signal using the test enable signal when the test enable signal is activated.

2. The integrated circuit chip of claim 1, wherein the reset control unit comprises:
   a pulse generation section configured to generate a pulse signal using the test enable signal; and
   a selection section configured to output the pulse signal as the system reset signal when the test enable signal is activated, and to output the signal input to the reset pad as the system reset signal when the test enable signal is deactivated.

3. The integrated circuit chip of claim 1, further comprising:
   a plurality of internal circuits configured to initialize internal signals in response to the system reset signal.

4. The integrated circuit chip of claim 1, wherein the signal combination unit comprises:
   a plurality of XOR gates and a plurality of inverters configured to combine the signals input to the plurality of test input pads.

5. The integrated circuit chip of claim 1, wherein, if the test enable signal is deactivated, supply of power to the signal combination unit is interrupted.

6. A memory device comprising:
   a test enable pad;
   a reset pad;
   a chip select pad;
   a plurality of control pads;
   a plurality of command pads;
   a plurality of address pads;
   a signal combination unit configured to combine signals, which are input to the reset pad, the plurality of control pads, the plurality of command pads, and the plurality of address pads, when a test enable signal input through the test enable pad is activated, and to generate a plurality of test output signals;
   an output circuit configured to output the plurality of test output signals through a plurality of data pads and a plurality of strobe pads in response to a chip select signal input through the chip select pad; and
   a reset control unit configured to generate a system reset signal using a signal input to the reset pad when the test enable signal is deactivated, and to generate the system reset signal using the test enable signal when the test enable signal is activated.

7. The memory device of claim 6, wherein the reset control unit comprises:
   a pulse generation section configured to generate a pulse signal using the test enable signal; and
   a selection section configured to output the pulse signal as the system reset signal when the test enable signal is activated, and to output the signal input to the reset pad as the system reset signal when the test enable signal is deactivated.

8. The memory device of claim 6, wherein the plurality of control pads comprise:
   one or more data mask pads;
   one or more data bus inversion pads;
   one or more clock pads;
   a clock enable pad;
   a parity pad;
   an on-die termination pad; and
   an alert pad.

9. The memory device of claim 6, further comprising:
   a plurality of internal circuits configured to initialize internal signals in response to the system reset signal.

10. The memory device of claim 6, wherein the test enable signal substantially maintains a deactivated state in a normal operation.

11. The memory device of claim 6, wherein the signal combination unit is configured to logically combine a first address signal, a sixth address signal, and a parity signal to generate a first test output signal,
    to invert the first test output signal to generate a second test output signal,
    to logically combine an eighth address signal, an alert signal, and a ninth address signal to generate a third test output signal,
    to invert the third test output signal to generate a fourth test output signal,
    to logically combine a second address signal, a fifth address signal, and a thirteenth address signal to generate a fifth test output signal,
    to invert the fifth test output signal to generate a sixth test output signal,
    to logically combine a $0^{th}$ address signal, a seventh address signal, and an eleventh address signal to generate a seventh test output signal,
    to invert the seventh test output signal to generate an eighth test output signal,
    to logically combine a clock bar signal, an on-die termination signal, and a column address strobe/fifteenth address signal to generate a ninth test output signal,
    to invert the ninth test output signal to generate a tenth test output signal,
    to logically combine a clock enable signal, a row address strobe/sixteenth address signal, and a tenth address/auto-precharge signal to generate an eleventh test output signal,
    to invert the eleventh test output signal to generate a twelfth test output signal,
    to logically combine an active signal, a fourth address signal, and a thirteenth bank address to generate a thirteenth test output signal,
    to invert the thirteenth test output signal to generate a fourteenth test output signal,
    to logically combine a data mask/data bus inversion up signal, a data mask/data bus inversion down signal, and a clock signal to generate a fifteenth test output signal,
    to invert the fifteenth test output signal to generate a sixteenth test output signal,
    to logically combine a write enable/fourteenth address, a twelfth address/burst chop signal, and a $0^{th}$ bank address signal to generate a seventeenth test output signal,
    to invert the seventeenth test output signal to generate an eighteenth test output signal, to logically combine a $0^{th}$ bank group address, a third address, and a reset signal to generate a nineteenth test output signal, and to invert the nineteenth test output signal to generate a twentieth test output signal.

12. The memory device of claim 11, wherein the output circuit is configured to output the first to thirteenth test output signals, the fifteenth test output signal, the seventeenth test output signal, and the eighteenth test output signal to $0^{th}$ to fifteenth data pads, and to output the fourteenth test output signal, the sixteenth test output signal, the nineteenth test output signal, and the twentieth test output signal to four data strobe pads.

* * * * *